United States Patent
Wang et al.

(10) Patent No.: US 9,177,650 B2
(45) Date of Patent: Nov. 3, 2015

(54) MEMORY DEVICE WITH MULTIPLE CELL WRITE FOR A SINGLE INPUT-OUTPUT IN A SINGLE WRITE CYCLE

(71) Applicant: Integrated Silicon Solution, Inc., Milpitas, CA (US)

(72) Inventors: MingShiang Wang, Cupertino, CA (US); Kyoung Chon Jin, San Ramon, CA (US)

(73) Assignee: Integrated Silicon Solutions, Inc., Milpitas, CA (US)

( * ) Notice: Subject to any disclaimer, the term of this patent is extended or adjusted under 35 U.S.C. 154(b) by 148 days.

(21) Appl. No.: 14/035,507

(22) Filed: Sep. 24, 2013

(65) Prior Publication Data

US 2015/0085580 A1    Mar. 26, 2015

(51) Int. Cl.
*G11C 16/08* (2006.01)
*G11C 16/20* (2006.01)

(52) U.S. Cl.
CPC .............. *G11C 16/08* (2013.01); *G11C 16/20* (2013.01)

(58) Field of Classification Search
CPC .... G11C 16/12; G11C 13/0026; G11C 16/08; G11C 16/20
USPC ........... 365/230.06, 185.23, 63, 185.05, 365/185.33, 230.08
See application file for complete search history.

(56) References Cited

U.S. PATENT DOCUMENTS

| | | | |
|---|---|---|---|
| 5,682,389 A | 10/1997 | Nizaka | |
| 5,896,340 A * | 4/1999 | Wong et al. | 365/230.03 |
| 6,282,128 B1 * | 8/2001 | Lee | 365/189.02 |
| 7,940,567 B2 * | 5/2011 | Moon et al. | 365/185.18 |
| 8,243,532 B2 | 8/2012 | Nirschl et al. | |
| 2009/0055577 A1 * | 2/2009 | Moon et al. | 711/103 |
| 2010/0128508 A1 * | 5/2010 | Maejima | 365/63 |
| 2011/0205795 A1 * | 8/2011 | Rai et al. | 365/185.05 |

* cited by examiner

*Primary Examiner* — Richard Elms
*Assistant Examiner* — Jerome Leboeuf
(74) *Attorney, Agent, or Firm* — Van Pelt, Yi & James LLP

(57) ABSTRACT

A non-volatile memory device incorporates a write buffer within a multi-level column decoder to enable multiple memory cells associated with a single write driver to be written in parallel. In this manner, in a non-volatile memory such as a flash memory that performs batch write operation, a group of data bits for a single I/O can be written to the memory cells at a time, thereby reducing the number of write cycles required for writing a block of program data and increasing the speed of write operation.

17 Claims, 4 Drawing Sheets

MEMORY DEVICE WITH MULTIPLE CELL WRITE FOR A SINGLE INPUT-OUTPUT IN A SINGLE WRITE CYCLE

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current and erase and programming cycles can be slow.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a non-volatile memory device incorporates a write buffer within a multi-level column decoder to enable multiple memory cells associated with a single write driver to be written in parallel. In this manner, in a non-volatile memory such as a flash memory that performs batch write operation, a group of data bits for a single I/O can be written to the memory cells at a time, thereby reducing the number of write cycles required for writing a block of program data and increasing the speed of write operation.

Figure 1:
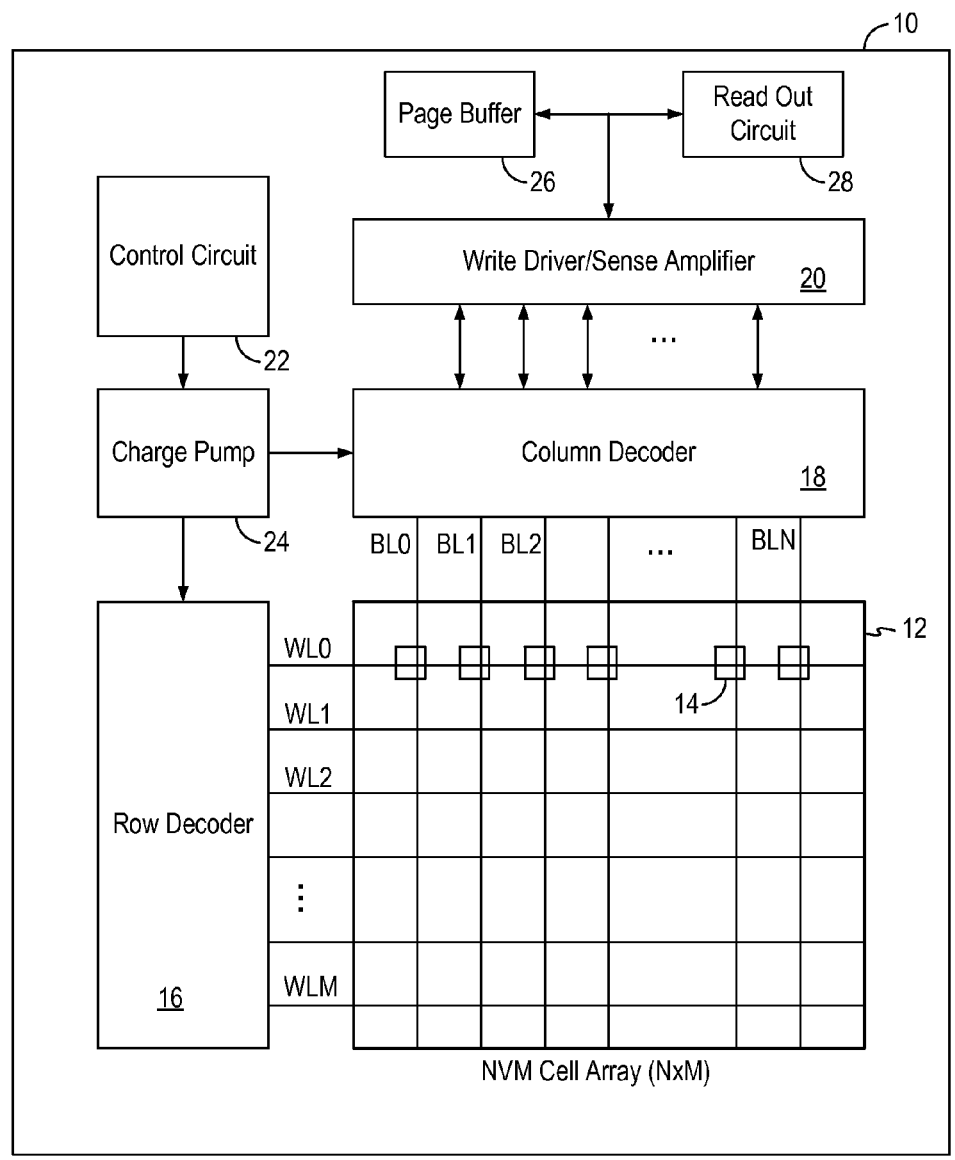
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash or a NOR flash. The cell array 12 is addressed by a row decoder 16 and a column decoder 18 to allow a control circuit 22 to selectively access the memory cells 14 for read, program (write) and erase operations. In particular, the flash memory cells 14 in the array 12 are accessed by word lines WL0 to WLM and bit lines BL0 and BLN. The row decoder 14 selectively activates a word line from WL0 to WLM and the column decoder selectively activates a bit line from BL0 to BLN to allow a memory cell 14 at the intersection of the selected word line and selected bit line to be access. A charge pump 24 is used to provide the appropriate voltage and current required for the erase and write operations of the NVM cell array 12. A write driver and sense amplifier circuit 20 is used to write data to or read data from the NVM cell array 12. In practice, the write driver and sense amplifier circuit 20 includes a bank of write drivers and sense amplifiers, one set of write driver and sense amplifier for each input/output (I/O) of the flash memory device. Each set of write driver and sense amplifier is coupled to a block of memory cells 14 in the cell array 12. The write driver and sense amplifier circuit 20 may be coupled to a page buffer 26 to receive program data to be written into the cell array 12 and may be further coupled to a read out circuit to provide data read out from the cell array 12 to external circuits. The memory architecture shown in FIG. 1 is illustrative only and it will be appreciated that the structure and methods described herein may be utilized in other memory architectures.

In the present embodiment, flash memory cells 14 are implemented using a floating gate MOS transistor device. A floating gate MOS transistor device includes a source region, a drain region, a control gate and a floating gate. The source and drain regions are formed in the semiconductor substrate with the channel region disposed in between. The floating gate and the control gate are vertically disposed above the channel region and at least partially overlapped. The floating gate is electrically isolated from the substrate by a thin gate oxide layer and is electrically isolated from the control gate by another dielectric layer. The control gate of the floating gate MOS transistor device is coupled to the word line of the cell array while the drain region is coupled to the bit line of the cell array. In a NOR flash memory, the source regions of the floating gate MOS transistor devices are connected to a shared source line which is typically connected to the ground potential.

The operation of the flash memory device 10 is well known and will be described in brief. In the present example, the flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the substrate to the floating gate by tunneling through the thin gate oxide layer. For example, an elevated voltage (e.g. 12V) is applied to the control gate to turn on the channel and electrons can flow from the source to the drain. An elevated voltage (e.g. 12V) is also applied to the drain terminal relative to the source terminal to generate electrons with sufficiently high energy ("hot electrons") so that hot electronic injection occurs and hot electrons jump through the gate oxide layer onto the floating gate. When the biasing voltages are removed, the charges are trapped on the floating gate and the memory cell is programmed to a logical state of 0.

Second, erasing the flash memory cell is performed by transferring charge carriers from the floating gate to the substrate by quantum tunneling. For example, an elevated voltage (e.g. 12V) is applied to the drain terminal with the control gate grounded and the source terminal grounded or floating. Electrons are pull off the floating gate into the drain and the substrate through quantum tunneling. When the floating gate is left with no charge carriers, the memory cell has a logical state of 1.

Finally, a flash memory cell is read by apply a gate voltage that is an intermediate threshold voltage of an erased memory cell and a programmed memory cell. When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the cell array 12, an input address is provided to flash memory device 10. The input address is divided into a row address which is coupled to the row decoder 16 and a column address which is coupled to the column decoder 18. Row decoder decodes the row address and activates one word line out of word lines WL0 to WLM and column decoder decodes the column address and activates one bit line out of bit lines BL0 to BLN. In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the conventional flash memory device activates one bit line for each associated write driver/sense amplifier in the flash memory device. In the following description, the operation of the flash memory device will be described with reference to a single write driver/sense amplifier or a single I/O. It is understood that the flash memory device includes a bank of write drivers and sense amplifiers for a set of I/Os, such as a byte of data.

The write or programming cycle of a flash memory cell is typically a time consuming process. Furthermore, in a conventional flash memory device, each write cycle activates only a single bit line for an associated I/O or each associated write driver. Thus, multiple write cycles are needed in order to write to a block of data that are associated with a single I/O, resulting in a long write operation time for writing a block of data to the flash memory device. In particular, most flash memory device supports batch write or page program operation. That is, the flash memory device allows a page of input data, such as 256 bytes, to be programmed into the memory device in a single operation. Thus, the flash memory device receives a page of program data, such as 256 bytes of data, stores the page of program data in a page buffer 26. However, the flash memory device can only write to one memory cell per I/O for each write cycle and thus it will take multiple write cycles, such as 256 cycles, to write in the full page of program data. The total time to write a page of program data is thus long.

In embodiments of the present invention, a non-volatile memory device incorporates a write buffer within a multi-level column decoder to enable multiple data bits to be written in parallel to memory cells associated with a single write driver or single I/O, thereby increasing the speed of the write operation and reducing the cycle time for writing a block of data to the non-volatile memory device.

Figure 2:
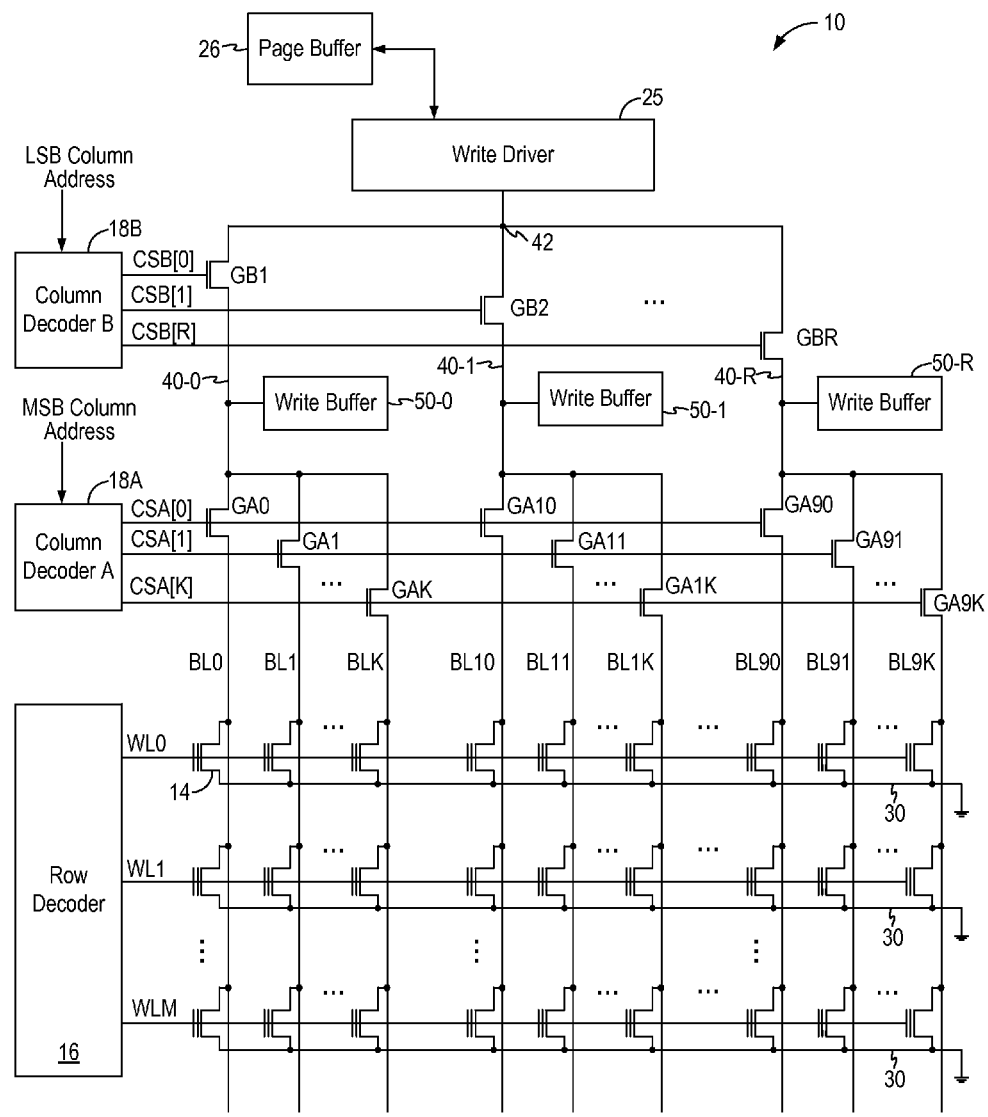
FIG. 2 is a schematic diagram of a portion of the circuitry of the non-volatile memory device of FIG. 1 for performing write operations in embodiments of the present invention.

FIG. 2 is a schematic diagram of a portion of the circuitry of the non-volatile memory device of FIG. 1 for performing write operations in embodiments of the present invention. More specifically, FIG. 2 illustrates the column decoder circuitry for enabling parallel write operations for a single write driver in embodiments of the present invention. Referring to FIG. 2, a write driver 25 associated with a single I/O of the flash memory device 10 is configured to write data to a portion of the memory cell array assigned to that I/O. For instance, the write driver 25 is disposed to write to flash memory cells 14 that are connected to bit lines BL0 to BL9K. As described above, the flash memory device 10 may include multiple I/Os and the write driver/sense amplifier circuit 20 includes a write driver for each of the I/O of the flash memory device. For instance, the flash memory device may be configured with 8 I/Os. In that case, the flash memory device includes eight write drivers, each write driver being coupled to a specific section of memory cells. FIG. 2 illustrates a single write driver associated with a single I/O of the flash memory device.

Flash memory cells 14 are arranged in a two-dimensional array with the bit lines defining the columns of the memory cells and word lines defining the rows of the memory cells. Each row of memory cells is connected to a common word line (WL0 to WLM). The row decoder 16 receives a row address and activates one word line among word lines WL0 to WLM in response to the row address. A memory cell is selected for access when the word line and the bit line associated with that memory cell are activated.

The bit lines of the memory array are selected by the column decoder. In the present embodiment, flash memory device 10 includes a column decoder that is implemented as a two-level decoder. Multi-level decoding is commonly used in memory devices to increase access speed and to reduce area for implementing the decoder. In the present embodiment, a two-level column decoder is illustrated. It is understood that the column decoder can be implemented using two or more levels of decoding in other embodiments of the present invention.

In the present embodiment, the flash memory device 10 includes a column decoder A (18A) and a column decoder B (18B) to implement two-level decoding. Column decoder A receives the most-significant bits of the column address while column decoder B receives the least-significant bits of the column address. For example, for a 10-bit column address, the column decoder A may receive the five most-significant bits of the column address while the column decoder B may receive the five least-significant bits of the column address. Column decoder A generates column select signals CSA[0] to CSA[K] for driving the control terminal of column select transistors GA (for example, GA1 to GAK, GA10 to GA1K and GA90 to GA9K), K being an integer of one or more. Column decoder A asserts one column select signal CSA from CSA[0] to CSA[K] for each column address to enable one column select transistor GAx in each group of K column select transistors. Meanwhile, column decoder B generates column select signals CSB[0] to CSB[R] for driving the control terminal of column select transistors GB (for example, GB1 to GBR), R being an integer of one or more. Column decoder B asserts one column select signal CSB from CSB[0] to CSB[R] for driving one column select transistor GBx of the set of column select transistors GB1 to GBR. Accordingly, with the column address thus decoded by column decoder A and column decoder B, two column select signals CSA and CSB are asserted to activate or turn on one GA column select transistor and one GB column select transistor. The activation of one GA column select transistor and one GB column select transistor selects a bit line from the group of bit lines BL0 to BL9K associated with the write driver 25.

As thus configured, the flash memory device 10 selects a word line and a bit line based on the input address and the write driver 25 provides the program data, such as the data stored on the page buffer 26. The program data is then written to the memory cell associated with the selected bit line and the selected word line. When operated in the conventional manner, each write cycle enables a single bit line and write program data to a single memory cell 14 associated with the write driver 25 or associated with the single I/O.

In embodiments of the present invention, the column decoder of the flash memory device 10 incorporates a bank of write buffers 50-0 to 50-R between the two levels of the column decoders. That is, the bank of write buffers 50-0 to 50-R is coupled between the column decoder A and the column decoder B. For instance, in the present embodiment, a write buffer is coupled to each intermediate node 40-0 to 40-R between the column decoder A and the column decoder B. In other embodiments, when the column decoder has multiple decoding levels, the bank of write buffers can be incorporated between any two decoding levels.

In the following description, for ease of explanation, the column decoder B is said to have a first node 42 being the common node of the column select transistors GB and coupled to the write driver 25. The column decoder B is said to have a set of second nodes 40-0 to 40-R being the intermediate nodes. Each second node 40 is associated with one column select transistor GB. The column decoder A is said to have a set of third nodes 40-0 to 40-R being the intermediate nodes and a set of fourth nodes, each fourth node coupled to a respective bit line BL0 to BL9K.

In one embodiment, a write buffer 50 is coupled to each intermediate node 40 between the column decoder A and the column decoder B. More specifically, a write buffer 50 is coupled to the second node 40 of each of the column select transistors GB associated column decoder B disposed to decode the least significant bits of the column address.

As thus configured, the flash memory device 10 stores a set of program data for the write driver 25 in write buffers 50-0 to 50-R where the set of stored program data is associated with a set of input column addresses having the same most significant column address bits. Each write buffer 50 stores a program data associated with a column address having the common most significant column address bits and respective least significant column address bits. Accordingly, the write buffers 50-0 to 50-R store program data for a set of input column addresses having common most significant address bits and having different least significant column address bits. The write operation to the write buffers can be carried out at a nominal power supply level, such as the Vdd voltage (e.g. 5V), as the write buffers do not require an elevated voltage, such as the Vpp voltage (e.g. 12V), to store the program data.

With the program data are loaded into the write buffers 50, the flash memory device 10 can then perform parallel writing of program data to the memory cells. In particular, the column select transistors GB are turned off and the respective column select transistors GA are turned on to allow the program data stored in each write buffer to be provided to the respective bit line. An elevated voltage, such as the Vpp voltage (e.g. 12V), is provided to the write buffer and the respective memory cell is then programmed to the program data stored in the write buffer. In each write cycle, multiple bit lines are activated simultaneously and multiple memory cells associated with the same write driver 25 are programmed in parallel. The total time for writing a block of data to the flash memory is reduced when multiple memory cells can be programmed in parallel. This is in contrast to the conventional flash memory write operation when only one memory cell associated with a write driver can be written at a time. Thus, a large number of write cycles are required in order to write a block of program data.

In the above described embodiment, the flash memory cell array is configured as a NOR array with the source terminals of the flash memory cells connected to the ground node 30. The non-volatile memory cell parallel write method and circuit of the present invention can be applied to a flash memory cell array configured as a NAND array. The NOR array in FIG. 2 is illustrative only.

Figure 3:
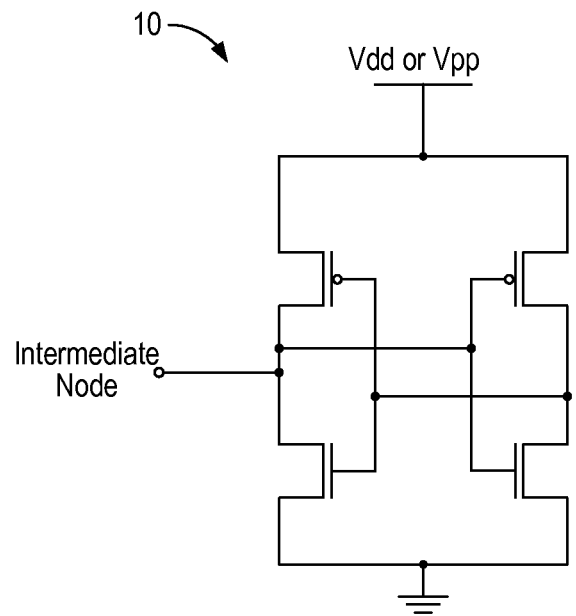
FIG. 3 is a circuit diagram of a write buffer in embodiments of the present invention.

In embodiments of the present invention, write buffers 50 can be implemented as a register or a latch or a buffer circuit. FIG. 3 illustrates an exemplary embodiment of a write buffer implemented as a latch formed by a pair of back-to-back inverters. The power supply to the latch is selectively coupled to the Vdd voltage or the Vpp voltage. When program data is to be stored into the write buffer, the write buffer is powered by the Vdd voltage only. When program data is to be supplied to the bit line to be programmed into a memory cell, the write buffer is powered by the Vpp voltage. In other embodiments, write buffers 50 can be implemented using other circuit configurations.

Figure 4:
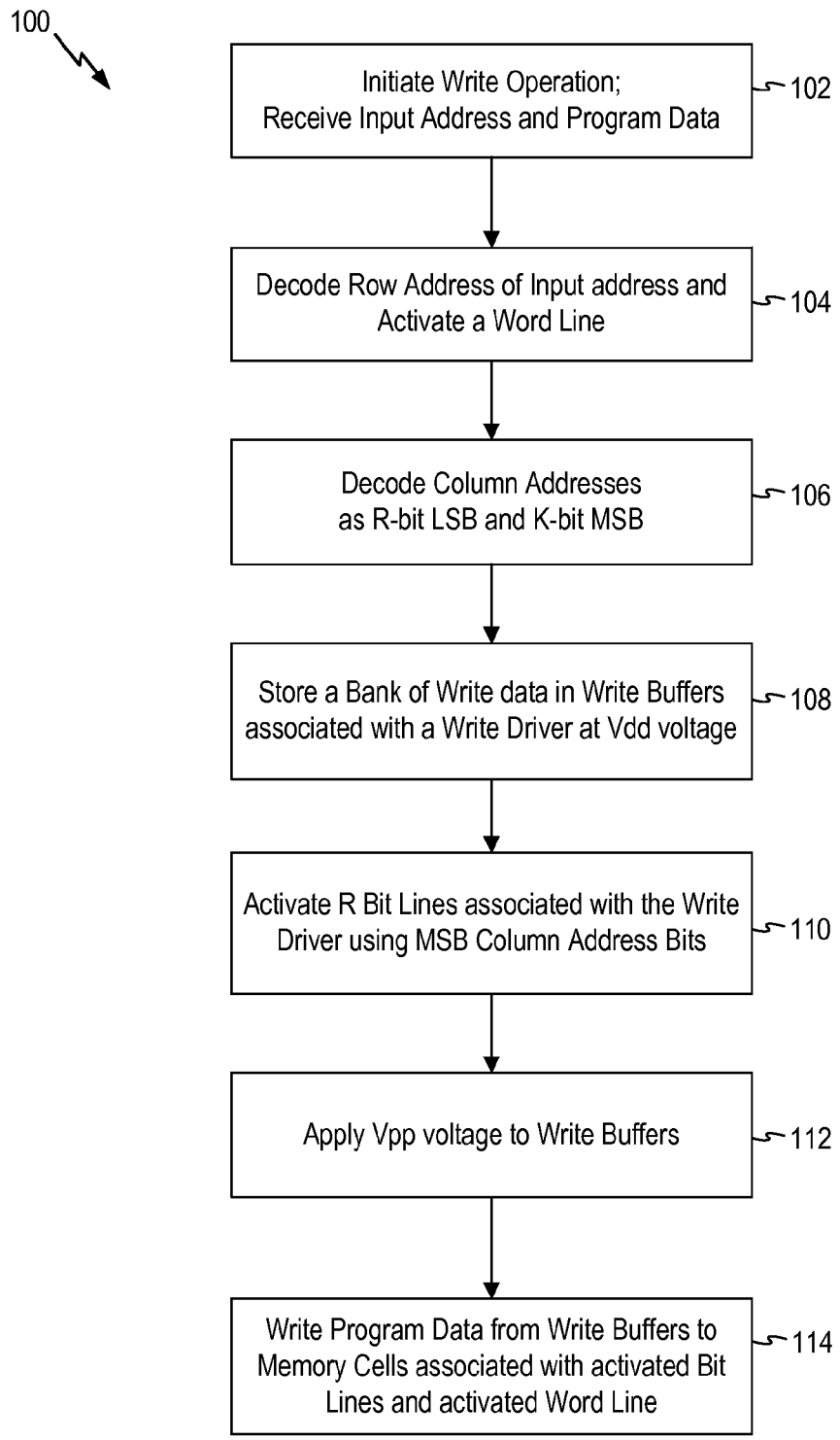
FIG. 4 is a flow chart illustrating the non-volatile memory cell parallel write method which can be implemented in the flash memory device of FIG. 2 in embodiments of the present invention.

FIG. 4 is a flow chart illustrating the non-volatile memory cell parallel write method which can be implemented in the flash memory device of FIG. 2 in embodiments of the present invention. The method in FIG. 4 will be described with reference to the flash memory device 10 of FIG. 2. Referring to FIG. 4, the non-volatile memory cell parallel write method 100 ("method 100") starts when a program or write operation is initiated at the flash memory device (102). The flash memory device receives an input address and a block of program data. The program data may be stored in page buffer 26 pending being written to the flash memory cells 14 in subsequent write cycles.

At 104, the flash memory device decodes the row address of the input address to select and activate a word line.

At 106, the flash memory device further decodes the column address using two or more levels of decoding. In the present embodiment, two level decoding is used and the column address is decoded in two levels as K most significant bits and R least significant bits, K and R being an integer of one or more. For a given I/O associated with a given write driver, the R least significant bits select one group of bit lines associated with the write driver and the K most significant bits of the column address select a specific bit line for each group of bit lines associated with the write driver.

At 108, method 100 stores program data into a bank of write buffers associated with a given write driver. More specifically, each write buffer is associated with a unique R-least significant bits column address and the bank of write buffers are associated with a common K-most significant bits column address. The program data are written to the write buffers at a nominal power supply voltage, such as the Vdd voltage.

At 110, after the write buffers are loaded with program data, method 100 activates the bit lines associated with a given write driver using the K-most significant column address bits. In particular, all bit lines associated with the same K-most significant column address bits are activated.

At 112, an elevated voltage, such as the Vpp voltage, is applied to the write buffers. At 114, the program data stored in the bank of write buffers are written to the flash memory cells associated with the activated bit lines and the activated word line. In this manner, multiple flash memory cells associated with a single write driver are written at the same time, thereby reducing the write cycles for writing a block of program data to the flash memory device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A non-volatile memory device, comprising:
    a two-dimensional array of non-volatile memory cells, each memory cell being accessed by a word line and a bit line, a first portion of the array of memory cells being associated with a first write driver and the first write driver being associated with a first input-output of the non-volatile memory device;
    a row decoder configured to control a plurality of word lines corresponding to rows of the array of memory cells, the row decoder being configured to activate one of the plurality of word lines in response to a row address;
    a first multi-level column decoder configured to control a plurality of bit lines corresponding to columns of the first portion of the array of memory cells, the first multi-level column decoder being configured to activate two or more bit lines within the first portion of the array of memory cells simultaneously in response to a plurality of column addresses; and
    a plurality of write buffers coupled to intermediate nodes of the first multi-level column decoder, the intermediate nodes of the first multi-level column decoder being nodes between a first decoding level and a second decoding level of the first multi-level column decoder,
    wherein the plurality of write buffers store program data for memory cells associated with the first write driver at a first power supply voltage level and the plurality of write buffers provides the stored program data to two or more bit lines to be written to memory cells associated with the first write driver at a second power supply voltage level greater than the first power supply voltage level, the first multi-level column decoder activating the two or more bit lines within the first portion of the array of memory cells simultaneously to write the program data provided by the write buffers into respective memory cells associated with the activated word line, the program data being written to two or more memory cells in the first portion of the array associated with the first input-output of the non-volatile memory device.

2. The non-volatile memory device of claim 1, wherein the first multi-level column decoder comprises a two-level column decoder comprising a first column decoder configured to decode K most significant bits of the column address, K being an integer of one or more, and a second column decoder configured to decode R least significant bits of the column address, R being an integer of one or more, the second column decoder having a first node coupled to the first write driver and a set of second nodes coupled to the first column decoder.

3. The non-volatile memory device of claim 2, wherein the plurality of write buffers comprises R write buffers, each write buffer being coupled to one of the second nodes between the first column decoder and the second column decoder, the plurality of write buffers storing program data associated with a set of column addresses having the same K most significant bits of the column address and having different R least significant bits of the column address.

4. The non-volatile memory device of claim 3, wherein the first multi-level column decoder activates R bit lines simultaneously to write program data stored in the R write buffers into respective memory cells associated with the activated word line.

5. The non-volatile memory device of claim 2, wherein the first column decoder comprises a first plurality of column select transistors and the second column decoder comprises a second plurality of column select transistors, the plurality of write buffers being coupled to the second plurality of column select transistors, each of the second plurality of column select transistors being selectively turned on to write program data into a respective write buffer.

6. The non-volatile memory device of claim 5, wherein the first plurality of column select transistors being selectively turned on while the second plurality of column select transistors being turned off to write the program data stored in the plurality of write buffers to the respective memory cells in the first portion of the array.

7. The non-volatile memory device of claim 1, wherein the two-dimensional array of non-volatile memory cells comprises flash memory cells configured in a NOR array.

8. The non-volatile memory device of claim 1, wherein the two-dimensional array of non-volatile memory cells comprises flash memory cells configured in a NAND array.

9. The non-volatile memory device of claim 1, wherein each of the plurality of write buffers comprises a latch or a register.

10. The non-volatile memory device of claim 1, wherein the first write driver is in communication with a page buffer to receive program data to be written to the memory cells of the array.

11. A method of writing program data to a non-volatile memory device, the non-volatile memory device comprising a two-dimensional array of non-volatile memory cells, each memory cell being accessed by a word line and a bit line, a first portion of the array of memory cells being associated with a first write driver and the first write driver being associated with a first input-output of the non-volatile memory device, the method comprising:

receiving an input address and a block of program data;
initiating a write operation at the non-volatile memory device;
decoding a row address of the input address to activate a word line;
decoding a column address of the input address using two or more levels of decoding;
storing, using a first voltage level, a set of program data for the first portion of the array of memory cells and associated with the first write driver, the set of program data being associated with memory cell addresses having common most significant address bits of the column address;
activating two or more bit lines within the first portion of the array of memory cells and associated with the first write driver simultaneously in response to the common most significant bits column address;
applying a second voltage level greater than the first voltage level to the stored program data; and
programming the program data into a set of memory cells within the first portion of the array of memory cells associated with the activated bit lines and the activated word line, the program data being written to two or more memory cells in the first portion of the array associated with the first input-output of the non-volatile memory device.

12. The method of claim 11, wherein storing, using a first voltage level, a set of program data for the first portion of the array of memory cells and associated with the first write driver comprises storing the set of program data in write buffers associated with the first write driver.

13. The method of claim 11, wherein receiving an input address and a block of program data comprises receiving the block of program data from a page buffer.

14. The method of claim 11, wherein decoding a column address of the input address using two or more levels of decoding comprises decoding a column address of the input address using two decoding levels, the method comprising:
decoding, using a first decoding level, K most significant bits of the column address, K being an integer of one or more; and
decoding, using a second decoding level, R least significant bits of the column address, R being an integer of one or more.

15. The method of claim 14, wherein storing, using a first voltage level, a set of program data for the first write driver comprises:
storing R program data associated with a set of column addresses having the same K most significant bits of the column address and having different R least significant bits.

16. The method of claim 11, wherein the two-dimensional array of non-volatile memory cells comprises flash memory cells configured in a NOR array.

17. The method of claim 11, wherein the two-dimensional array of non-volatile memory cells comprises flash memory cells configured in a NAND array.

\* \* \* \* \*